US008452578B2

(12) United States Patent
Shiraishi

(10) Patent No.: US 8,452,578 B2
(45) Date of Patent: May 28, 2013

(54) SIMULATION METHOD OF NOISE PERFORMANCE OF TIRE AND METHOD OF PRODUCING TIRE

(75) Inventor: Masaki Shiraishi, Hyogo (JP)

(73) Assignee: Sumitomo Rubber Industries, Ltd., Kobe-Shi (JP)

( * ) Notice: Subject to any disclaimer, the term of this patent is extended or adjusted under 35 U.S.C. 154(b) by 284 days.

(21) Appl. No.: 12/744,812

(22) PCT Filed: Oct. 28, 2008

(86) PCT No.: PCT/JP2008/069554
§ 371 (c)(1),
(2), (4) Date: May 26, 2010

(87) PCT Pub. No.: WO2009/087803
PCT Pub. Date: Jul. 16, 2009

(65) Prior Publication Data
US 2010/0305746 A1     Dec. 2, 2010

(30) Foreign Application Priority Data

Jan. 9, 2008     (JP) .................................. 2008-002460

(51) Int. Cl.
*G06G 7/48*     (2006.01)
(52) U.S. Cl.
USPC .......................................................... 703/7
(58) Field of Classification Search
USPC .......................................................... 703/7
See application file for complete search history.

(56) References Cited

U.S. PATENT DOCUMENTS

| | | | | |
|---|---|---|---|---|
| 5,295,087 A | * | 3/1994 | Yoshida et al. | 703/6 |
| 6,430,993 B1 | * | 8/2002 | Seta | 73/146 |
| 6,564,625 B1 | * | 5/2003 | Ishiyama | 73/146 |

(Continued)

FOREIGN PATENT DOCUMENTS

| JP | 2001-9838 A | 1/2001 |
|---|---|---|
| JP | 2002-7489 A | 1/2002 |

(Continued)

OTHER PUBLICATIONS

Sungtae Kim et al., "Prediction method for tire air-pumping noise using a hybrid technique," 2006, Journal of the Acoustical Society of America, vol. 119, No. 6, pp. 3799-3812.*

(Continued)

*Primary Examiner* — Dwin M Craig
*Assistant Examiner* — Russ Guill
(74) *Attorney, Agent, or Firm* — Birch, Stewart, Kolasch & Birch, LLP

(57) ABSTRACT

A method for simulating tire noise performance using a computer includes a step S1 of setting, using a finite number of elements, a tire model having a tread model portion provided with a tread groove, a step S2 of setting a road surface model using a finite number of elements, a step S4 of carrying out a rolling simulation to roll the tire model on the road surface model at least over a groove-grounded rolling distance between which the tread groove is brought into and out of contact with the road surface model; a step S5 of acquiring a surface coordinate value of the tread model portion in a time-series manner, and a step S7 of setting a sound space region around the tread model portion using the surface coordinate value of the tread model portion and of carrying out an aerodynamic simulation using the sound space region.

6 Claims, 14 Drawing Sheets

U.S. PATENT DOCUMENTS

| | | | |
|---|---|---|---|
| 7,066,018 B2* | 6/2006 | Miyamoto et al. | 73/146 |
| 2003/0150539 A1* | 8/2003 | Kolowski et al. | 152/209.2 |
| 2004/0144168 A1* | 7/2004 | Oku | 73/146 |
| 2007/0233438 A1* | 10/2007 | Quimper et al. | 703/6 |

FOREIGN PATENT DOCUMENTS

| | | |
|---|---|---|
| JP | 2003-341315 A | 12/2003 |
| JP | 2004-338660 A | 12/2004 |
| JP | 2007-203928 A | 8/2007 |
| JP | 2007-210472 A | 8/2007 |
| JP | 2007-237751 A | 9/2007 |

OTHER PUBLICATIONS

M.J. Gagen, "Novel acoustic sources from squeezed cavities in car tires," 1999, Journal of the Acoustical Society of America, vol. 106, No. 2, pp. 794-801.*

Ard Kuipers et al., "Tyre/Road noise models in the last two decades: a critical evaluation," 2001, The 2001 International Congress and Exhibition on Noise Control Engineering, six pages.*

Byoung Sam Kim et al., "The identification of sound generating mechanisms of tyres," 2007, Applied Acoustics, vol. 68, pp. 114-133.*

Ulf Sandberg, "A closer look at the tread groove resonance in Tyre/Road Noise," 2004, Proceedings of the 18th International Conference on Acoustics (ICA 2004), pp. 2195-2198.*

Tamas Regert et al., "Investigation of flow field past rotating wheels of cars," 2003, The 12th International Conference on Fluid Flow Technologies, seven pages.*

W.S. Smith et al., "Simulations of flow around a cubical building: comparison with towing-tank data and assessment of radiatively induced thermal effects," 2001, Atmospheric Environment, vol. 35, pp. 3811-3821.*

K. Larsson et al., "A high-frequency three-dimensional tyre model based on two coupled elastic layers," 2002, Journal of Sound and Vibration, vol. 253, No. 4, pp. 889-908.*

Maik Brinkmeier et al., "A finite element approach for the simulation of tire rolling noise," Jan. 8, 2008, Journal of Sound and Vibration, vol. 309, pp. 20-39.*

Pierre Guisset et al., "TINO Noise Emission: Analysis and Prediction Models," 1999, 1st International Colloquium On Vehicle Tyre Road Interaction, five pages.*

* cited by examiner

SIMULATION METHOD OF NOISE PERFORMANCE OF TIRE AND METHOD OF PRODUCING TIRE

BACKGROUND OF THE INVENTION

1. Technical Field

The present invention relates to a simulation method that is useful for evaluation of noise performance of a tire with satisfactory accuracy, and to a method of producing a tire.

2. Background Art

Conventionally, development of tires has been carried out through repeated work of preparing a model, testing the model, and preparing a developed model in view of test results. This method has a problem in that the production of models and testing thereof require a lot of time and cost. In order to overcome this problem, in recent years, such methods have been proposed that use computer simulation utilizing numerical analysis techniques such as a finite element method to predict and analyze the performance of tires to some extent without prototyping a tire (see, e.g., patent document 1 listed below).

However, almost all the analysis by the above-mentioned computer simulation is only with respect to forces that act on tires at the time of running, such as forces from forward, rearward, upward, downward, and sideward, and to the degree of deformation such as strain. Thus, there is no specific reference to noise performance.

[Patent Document 1]
Japanese Patent Application Publication No. 2002-7489.

DISCLOSURE OF THE INVENTION

Technical Problems to be Solved

The present invention has been made in view of the above-described circumstances. A main object of the present invention is to provide a simulation method of tire noise performance by which noise occurring at the time of running can be estimated with satisfactory accuracy, and to provide a method of producing a tire utilizing the simulation method, on the basis of: carrying out a rolling simulation using a tire model that has a tread model portion provided with a tread groove; obtaining a deformation state of the tread model portion including the tread groove; determining a sound space region around the tread model portion using a surface coordinate value of the tread model portion; and carrying out an aerodynamic simulation using the sound space region.

Means of Solving the Problem

According to a first aspect of the present invention, a method for simulating tire noise performance using a computer includes a step of setting, using a finite number of elements, a tire model having a tread model portion provided with at least one tread groove; a step of setting a road surface model using a finite number of elements; a step of carrying out a rolling simulation to roll the tire model on the road surface model at least over a groove-grounded rolling distance where the tread groove is grounded on the road surface model and rolled; a step of acquiring a surface coordinate value of the tread model portion in the groove-grounded rolling distance in a time-series manner; a step of setting a sound space region around the tread model portion, the sound space region having a shape changing based on the acquired surface coordinate value of the tread model portion; and a step of carrying out an aerodynamic simulation using the sound space region.

According to a second aspect of the present invention, a method for producing a pneumatic tire includes a step of carrying out a simulation method set forth in the first aspect of the present invention; a step of designing a tread pattern based on a tread model portion of a tire model used in the simulation method; and a step of molding a tire having the tread pattern by vulcanization.

Effect of the Invention

The noise at the time of running of a tire is largely influenced by, for example, a variation in inner-groove air pressure that occurs when the tread groove comes into contact with or out of contact from the road surface, and the surface vibration of the tread portion at the time of contact of the tread groove with the road surface. In view of this, in the simulation method of tire noise performance according to the embodiment of the present invention, a tire model that has a tread model portion provided with a tread groove is used to carry out a rolling simulation at least over a groove-grounded rolling distance where the tread groove is grounded on a road surface model and rolled. Then, a surface coordinate value of the tread model portion is acquired from a result of the rolling simulation in a time-series manner; a sound space region is determined around the tread model portion using the coordinate value; and an aerodynamic simulation is carried out using the sound space region. This enables incorporation of, as a deformation of the sound space region in the aerodynamic simulation, a deformation involved in grounding and opening of the tread groove, a deformation of the surface of the tread portion at the time of contact of the tread groove with the road surface, and the like deformation. Thus, the first aspect of the present invention enables accurate calculation or estimation of noise that occurs at the time of tire running.

According to the second aspect of the present invention, a pneumatic tire that excels in noise performance can be produced with satisfactory efficiency.

BRIEF DESCRIPTION OF DRAWINGS

FIG. 7(A) is a side view and FIG. 7(B) is a perspective view.

BRIEF DESCRIPTION OF NUMERALS

Figure 1:
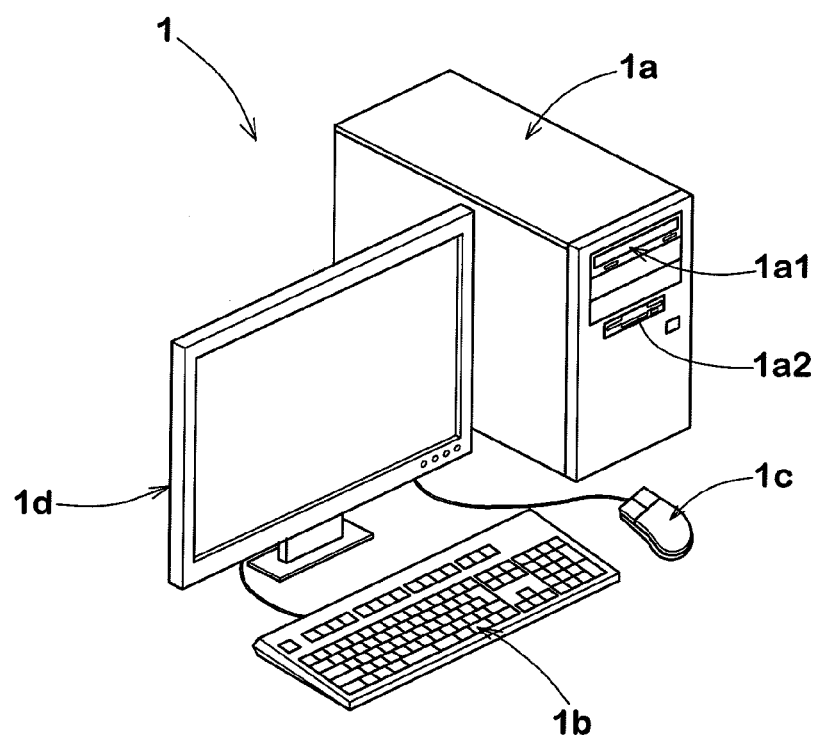
FIG. 1 is a general perspective view of a computer device used in calculation in a simulation method of an embodiment of the present invention.

1 Computer device
2 Tire model
2A Tread model portion
2B Body model portion
2a, 2b, 2c, Elements
3 Lateral groove
4 Road surface model
5 Sound space region
5a Inner groove region
5b Main region
8 Vertical groove DETAILED DESCRIPTION OF THE INVENTION AND BEST MODE FOR CARRYING OUT THE INVENTION A simulation method according to the present embodiment is carried out using, for example, a computer device 1 as shown in FIG. 1. The computer device 1 is constructed including a main unit 1a, a keyboard 1b as means of input, a mouse 1c, and a monitor device 1d as means of output. The main unit 1a contains a CPU, a ROM, a working memory, and a mass storage device such as a magnetic disk (all of the foregoing is not shown), and includes drive devices 1a1 and 1a2 such as for CD-ROMs, as appropriate. The storage device stores a processing procedure (a program) with which to carry out a method described later.

Figure 2:
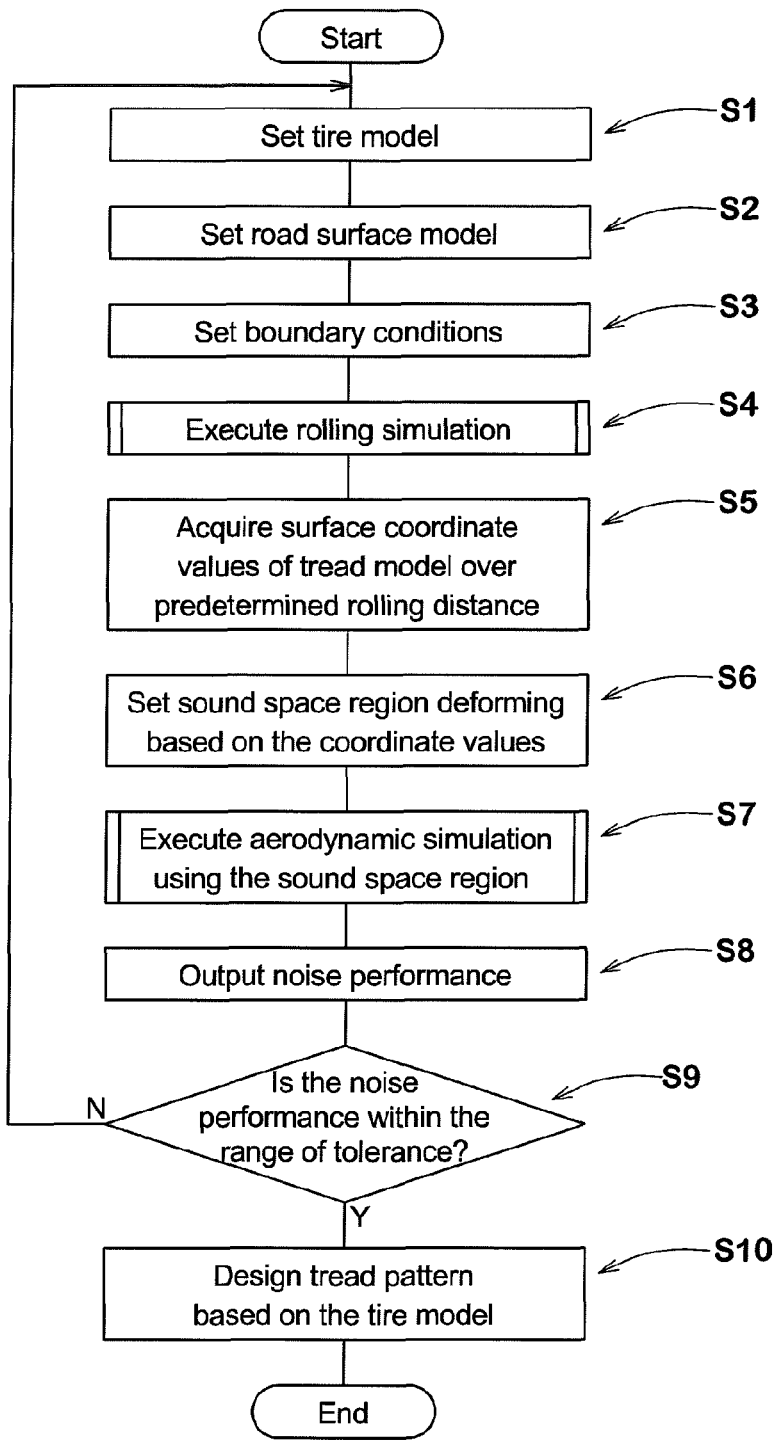
FIG. 2 is a flowchart showing an exemplary processing procedure of the simulation method of an embodiment of the present invention.
Figure 3:
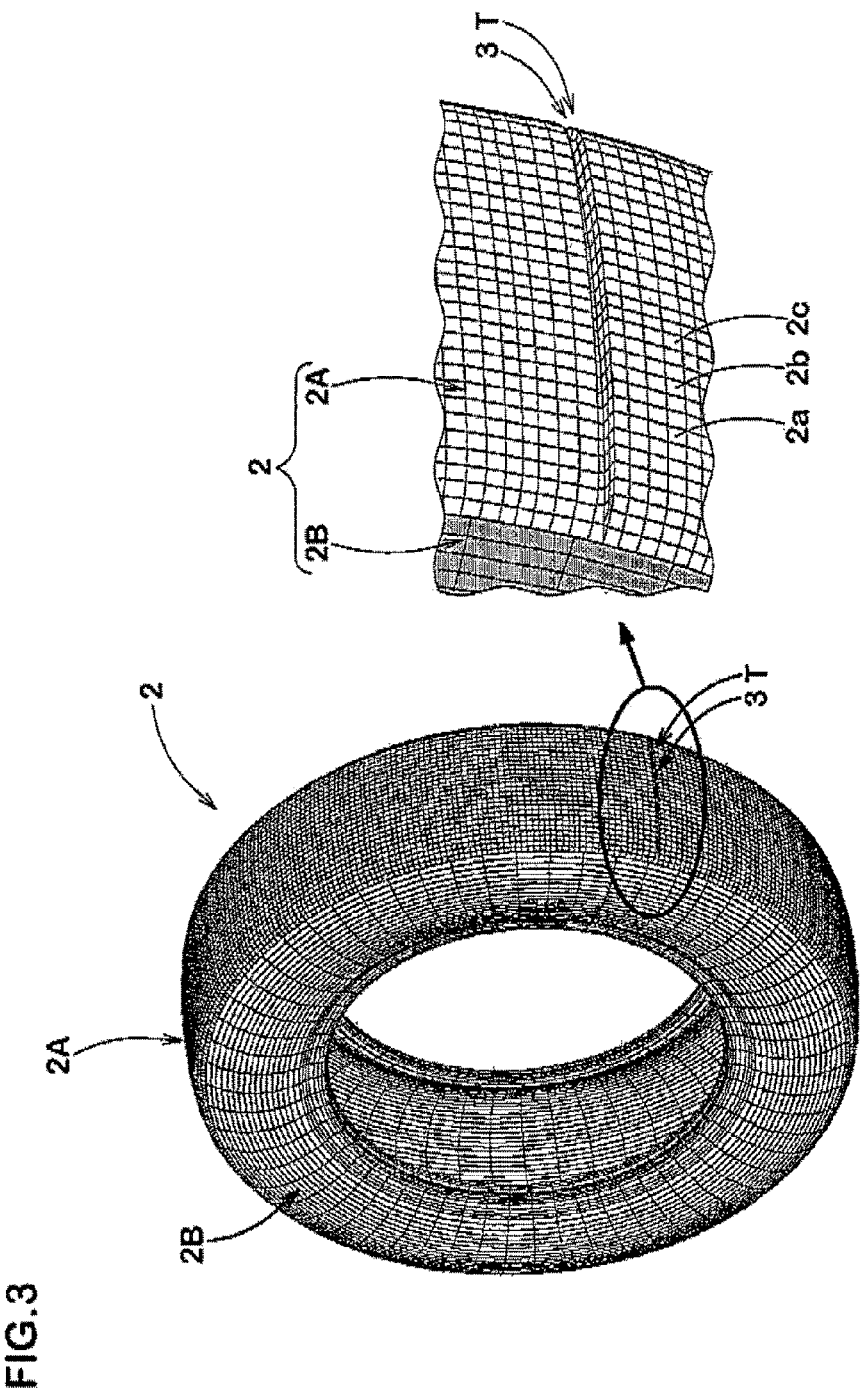
FIG. 3 is a general perspective view of a visualized tire model.

FIG. 2 shows a flowchart that includes a processing procedure of the simulation method of the present embodiment. In the simulation method of the present embodiment, a tire model 2 as shown in FIG. 3 is first set (step S1). FIG. 3 shows an example of the tire model 2 visualized three-dimensionally.

The tire model 2 of the present embodiment is represented by a to-be-analyzed tire (regardless of whether the tire actually exists) that is divided (discretized) into numerically analyzable finite, small elements 2a, 2b, 2c, and so forth. In other words, the tire model 2 is an aggregate of the finite, small elements 2a, 2b, 2c, and so forth. Examples of the each elements 2a, 2b, 2c, and so forth include two-dimensional planes such as triangular or quadrangular film elements, and three-dimensional elements such as tetrahedral or hexahedral solid elements.

"Numerically analyzable" means that a variant computation of a model is viable by a numerical analysis method such as a finite element method, a finite volume method, a differential method, and a boundary element method. Hence, for the each elements 2a, 2b, 2c, and so forth, coordinate values at respective nodes, element shapes, and physical property values (e.g., density, elastic modulus, and attenuation coefficient) of a material that each element represents are defined as appropriate. An actual material of such tire model 2 is numerical data that can be handled on the computer device 1.

The tire model of the present embodiment is constructed including a ring-shaped tread model portion 2A that results from dividing a tread portion into finite elements, and a toroidal body model portion 2B (a portion colored in gray in the enlarged view on the right side of the figure) that is a portion radially inward relative to the tread model portion 2A. The body model portion 2B of the present embodiment includes a pair of sidewall portions and a pair of bead portions. The tire model 2 preferably contains, in an inside thereof, elements that are assumed to be reinforcing fiber materials such as a carcass and a belt layer. This makes a deformation behavior of the tread model portion 2A closer to that of a real tread portion, thereby providing for a simulation of satisfactory accuracy. Further, in order to obtain a more detailed deformation behavior, the tread model portion 2A is preferably divided into more fine elements than the body model portion 2B. It should be noted that while the tire model 2 of the present embodiment is modeled continuously in the form of a ring, a partial modeling, for example, in the circumferential direction of the tire is also possible insofar as a necessary amount of rolling is obtained.

The tread model portion 2A is provided with at least one tread groove T. In the present embodiment, the tread groove T is constructed including one lateral groove 3 extending in parallel to the axial direction of the tire. It should be noted, however, that the tread groove T will not be limited to such embodiment, and that the number of tread grooves T and their angle with respect to the circumferential direction of the tire may be changed as appropriate.

Figure 4:
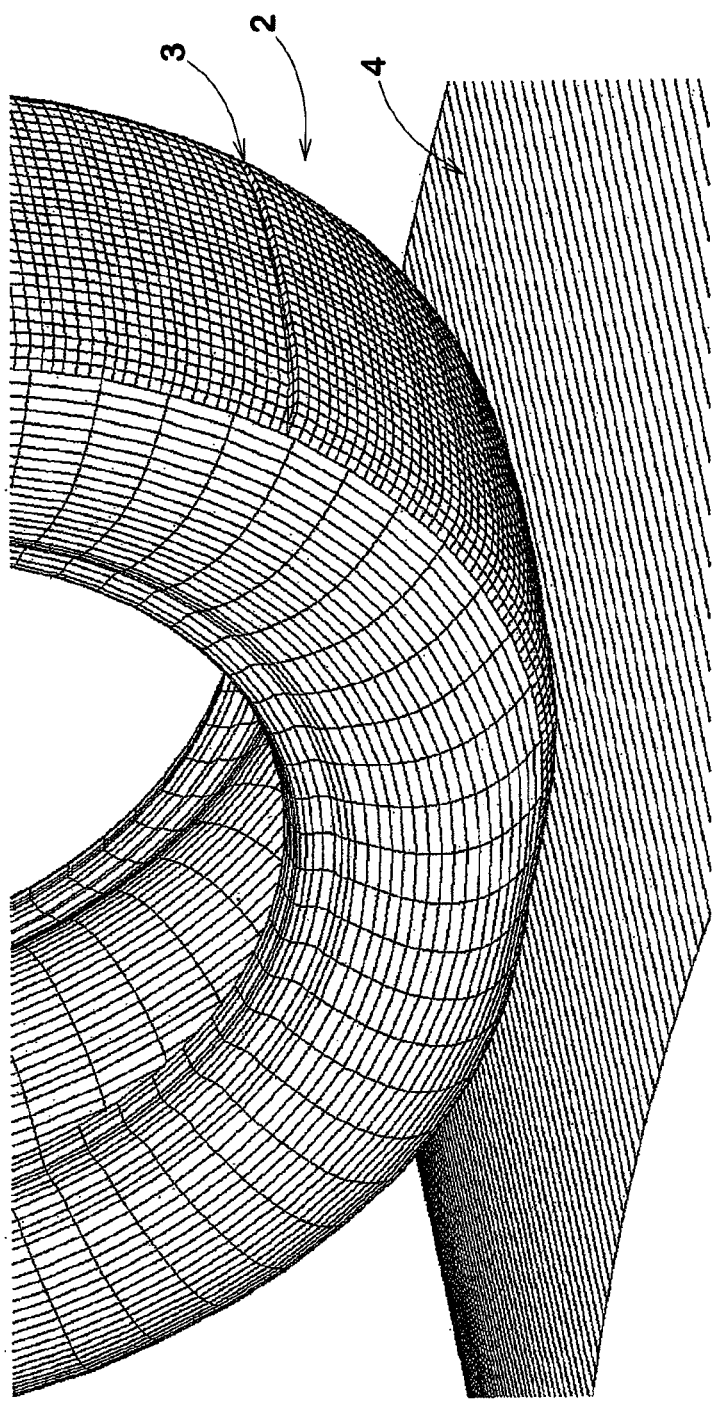
FIG. 4 is a partial perspective view showing a visualized tire model and a visualized road surface model in such a state that they are brought into contact with one another.

Next, as shown in FIG. 4, a road surface model 4 is set using a finite number of elements (step S2). The road surface model 4 of the present embodiment is set as having a cylindrical, smooth surface. In the present embodiment, to examine a simulation result, a real tire is estimated as to noise performance on a drum tester. To secure coherence between the real tire estimation and the simulation result, the simulated road was set as having a curvature. Such road surface model 4 can be easily set by, for example, connecting one or a plurality of rigid surface elements. While the road surface model 4 of the present embodiment has a flat surface, a roughness as can be seen on real roads may be provided as necessary, examples including fine concaves and convexes, irregular steps, depressions, winding, and/or ruts, as can be seen on asphalt road surfaces.

Next, various boundary conditions for rolling the tire model 2 on the road surface model 4 are set (step S3), and then a rolling simulation is carried out (step S4).

Examples of the boundary conditions include rim-mounting conditions and internal pressure conditions of the tire model 2, a vertical load that acts on a rolling axis of the tire model 2, a slip angle, a camber angle, a rolling speed, a coefficient of friction between the tire model 2 and the road surface model 4, and an initial time increase in calculation of deformation of the tire model 2.

Figure 5:
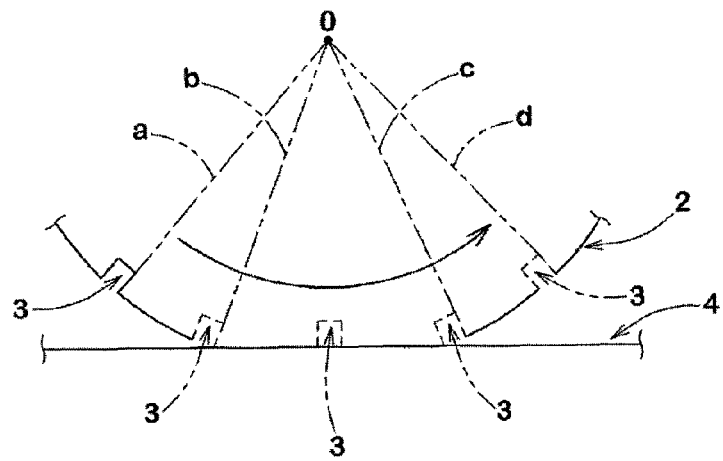
FIG. 5 is a schematic side view visualizing contact of the tire model and the road surface model.

As shown in FIG. 5, in the rolling simulation the tire model 2 is rolled on the road surface model 2 at least over a groove-grounded rolling distance where the lateral groove 3 of the tread model portion 2A is grounded on the road surface model 4 and rolled. In the present embodiment, the rolling simulation is carried out over a distance of a-d (of FIG. 5), from "a" which is before grounding of the lateral groove 3 of the tire model 2 on the road surface model 4, through "b-c" which is the groove-grounded rolling distance, and to "d" where the lateral groove 3 is completely out of contact from the road surface model 4. Such rolling distance can be set conveniently insofar as the groove-grounded rolling distance is included.

The rolling simulation may be, for example, such a method that the tire model 2 is defined rotatably about a rotation axis O (shown in FIG. 5) and rolled by moving the road surface model 4 that is in contact with the tire model 2, or such a method that the road surface model 4 is fixed and a rotational speed and a translational speed are imparted to the tire model 2 to roll it on the road surface model 4.

In the rolling simulation, a deformation calculation of the tire model 2 is carried out. In this deformation calculation, a mass matrix, a rigidity matrix, and an attenuation matrix of each of the elements are created on the basis of the shape, material properties, and the like of each of the elements. These matrixes are combined to create a matrix of the whole system. Then, the above-described various conditions are applied to sequentially create and store equations of motion on the computer device 1 on a minute time increment Δt basis. This enables a detailed time-series calculation of the deformation behavior of the rolling tire model 2, especially the deformation behavior of the lateral groove 3 of the tread model portion 2A and the deformation behavior of other parts of the tread surface than the groove.

The above-described rolling simulation may be carried out using, for example, analysis application software that utilizes the finite element method (e.g., LS-DYNA, developed and improved by Livermore Software Technology Corporation (US)). From a result of such rolling simulation, a three-dimensional surface coordinate value of the tread model portion 2A including at least the above-described groove-grounded rolling distance b-c is obtained in a time-series manner (step S5). It should be noted that while the surface coordinate value may suffice when including the surface coordinate value of the tread model portion 2A including the lateral groove 3, it will be readily understood that whole surface data of the tire model 2 may be incorporated.

Next, a sound space region 5 is set (step S6), and an aerodynamic simulation is carried out in the sound space region 5 (step S7).

The aerodynamic simulation is a kind of a fluid simulation and carried out separately from the rolling simulation, which is a structural analysis. In the flow simulation, a sound space region where an analyzed fluid flows is determined first. The sound space region is discretized by being divided into elements, and each of the elements is imparted a physical quantity that is influential to noise performance, examples of such physical quantity including a flow rate and pressure of the fluid (air). Then a calculation is carried out for each of the elements while taking into account a balance of force and a conservation of mass. The motion of the fluid (which is air in the present embodiment) is represented by, for example, a Navier-Stokes equation. The Navier-Stokes equation is calculated by, for example, being converted into an approximate equation that is calculable on the computer device 1 to calculate the motion of the fluid, that is, a pressure and a rate at each of the elements. Examples of the method of the discretization include a differential method, a finite volume method, and a finite element method. Such aerodynamic simulation may be carried out using commercially available application software for fluid analysis such as STAR-CD of CD-adapco and FLUNET of ANSYS, Inc.

The sound space region 5 is determined as a space where air flows and sound occurs around the tire model 2 in the aerodynamic simulation. The sound space region 5 of the present embodiment is set on the basis of the surface coordinate value of the tread model portion 2A and the surface coordinate value of the road surface model 4 obtained in step S5. Hence, the sound space region 5 changes its shape in accordance with a time-series change in the above-described surface coordinate values. In other words, a change in the shape of the tread model portion 2A in the rolling simulation is reflected in the sound space region 5.

Figure 6A:
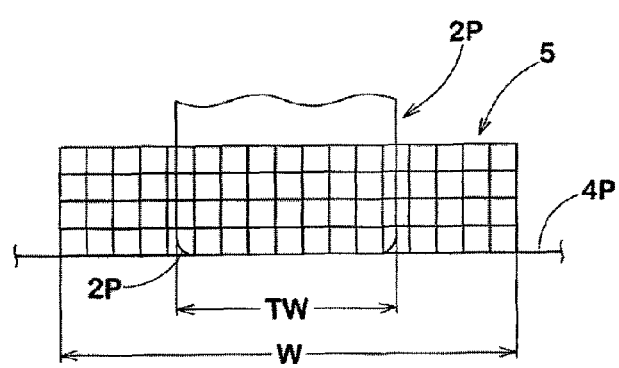
FIG. 6(A) is a frontal view showing an embodiment of a sound space region, and 6(B) is a side view of the sound space region.
Figure 6B:
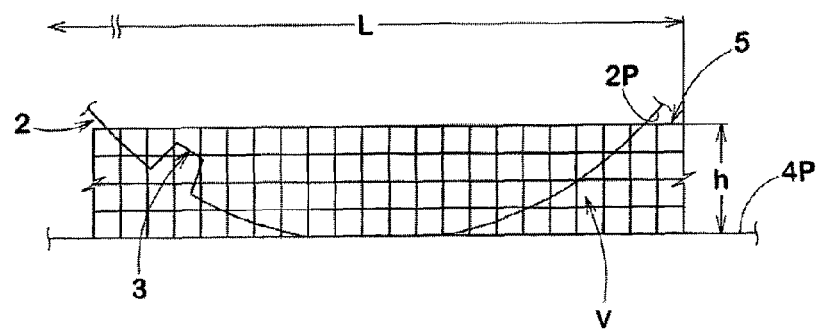

FIGS. 6(A) and 6(B) show an example of the sound space region 5. FIG. 6(A) is a frontal view of the sound space region 5, and FIG. 6(B) is a side view of the sound space region 5. In the present embodiment, first, a road surface shape 4P is set on the basis of the surface coordinate value of the road surface model 4, and a tire surface shape 2P obtained from the rolling simulation of the tire model 2 is obtained.

Next, on the road surface shape 4P, a cuboid region V is set as if to cross the tire surface shape 2P, the cuboid region V having a width W that is larger than an axial width TW of the tire surface shape 2P, a front-back length L that is necessary for the rolling simulation of the tire surface shape 2P, and a height h that is set conveniently. The sides of the cuboid region V serve as boundaries defining outer peripheries of the sound space region 5. This limits the calculation region of the aerodynamic simulation, thereby contributing to reduction in calculation time. It should be noted, however, that the shapes of the boundaries of the sound space region 5 will not be limited to the above-described cuboid region embodiment.

The cuboid region V is divided into a finite number of small elements (which are three-dimensional hexahedral solid elements in the present embodiment). Since the tire surface shape 2P is rolled in this example, it is not necessary to move the nodes of the elements of the cuboid region V. Each of the nodes of the elements is imparted a fluid physical quantity and calculated.

Since the sound space region 5 is a space where a fluid containing air flows, the air does not exceed the tire surface shape 2P into an interior of the tire and does not exceed the road surface shape 4P into an interior of the road surface. Hence, the sound space region 5 is determined as a region having the tire surface shape 2P and the road surface shape 4P as boundaries (walls). Thus, in the embodiment of FIGS. 6(A) and 6(B), the sound space region 5 is determined by subtracting the tire surface shape 2P from the cuboid region V. For this reason, the position of the tire surface shape 2P in the cuboid region V is calculated in a constant manner. It will be understood that no air flows through a portion of contact between the tire surface shape 2P and the road surface shape 4P, and thus the sound space region 5 is not formed at the portion of contact except for a portion corresponding to the inner groove space of the tread groove T.

Figure 7A:
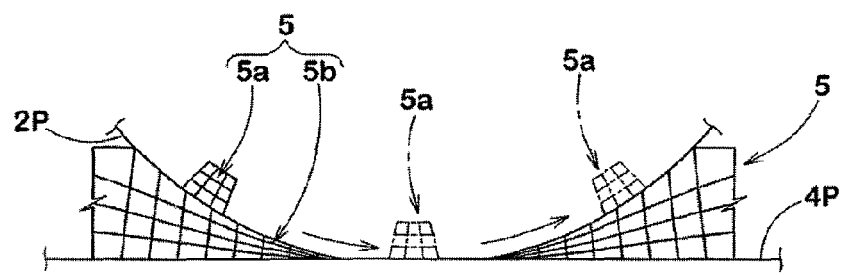
FIGS. 7(A) and 7(B) show another embodiment of the sound space region.
Figure 7B:
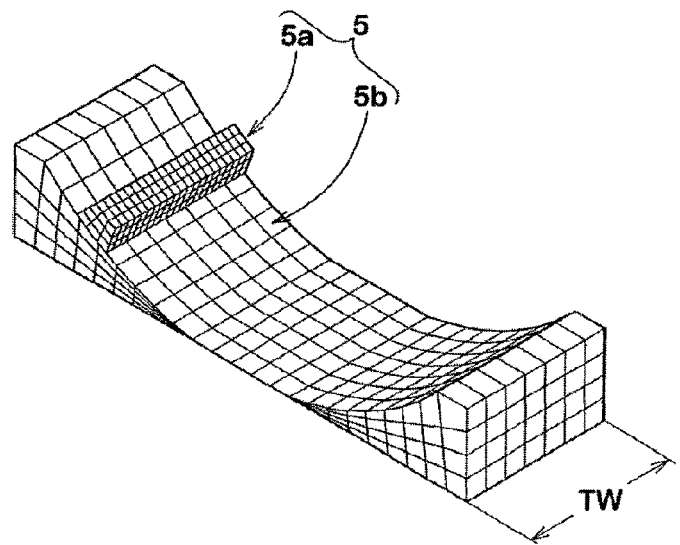

FIGS. 7(A) and 7(B) show another embodiment of the sound space region 5. The sound space region 5 of this embodiment is defined as a space having any convenient circumferential length held between the tire surface shape 2P and the road surface shape 4P. Also, the sound space region 5 is divided into elements that include an inner groove region 5a corresponding to an inner space of the lateral groove 3 of the tread model portion 2A and a main region 5b as a region other than the inner groove region 5a. With such sound space region 5, while the position of the main region 5b is fixed in the aerodynamic simulation, the inner groove region 5a can be moved in the circumferential direction of the tire along the main region 5b as shown by a phantom line in 7(A), thereby making it possible to reproduce the rolling state of the tire. Such sound space region 5 is preferred to the above-described embodiment in that a miniaturization is realized and the calculation time is shortened.

Additionally, by the movement of the inner groove region 5a on the main region 5b in the above-described manner, the nodes of the elements on the boundary between the regions 5a and 5b move relatively to each other. This causes a change in volume of the elements and/or a change in air pressure. Thus, such sound space region 5 enables an equal reproduction of such a phenomenon of a real tire that the movement of the lateral groove causes air vibration which in turn causes a change in air pressure around the surface of the tire tread. It should be noted that while the sound space region 5 of the embodiment of FIGS. 7(A) and 7(B) is formed with a width that is approximately equal to the axial width TW of the tire surface shape 2P, the main region 5b may have a width larger than the axial width TW of the tire surface shape 2P and expanded to both sides of the tire surface shape 2P, as shown in FIG. 8, for example.

Figure 8:
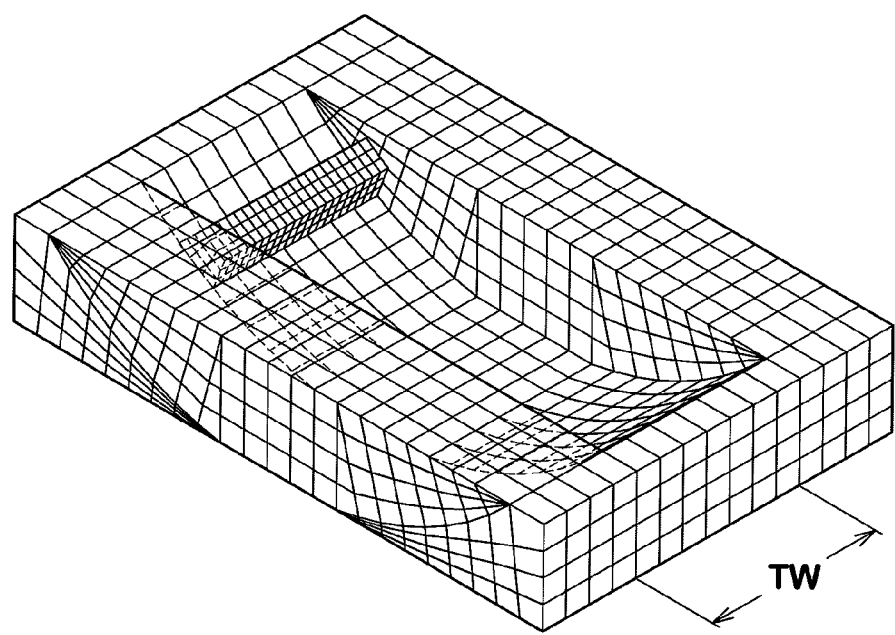
FIG. 8 is a perspective view showing another embodiment of the sound space region.
Figure 9A:
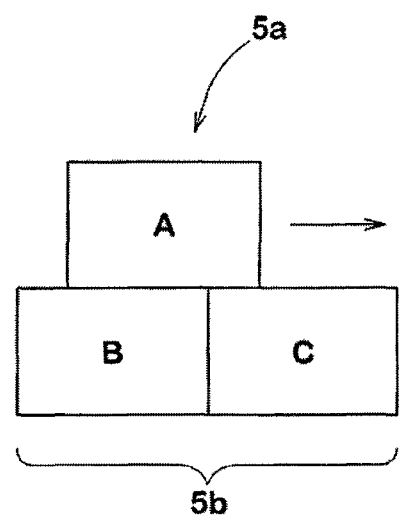
FIGS. 9(A) and 9(B) are diagrams for illustrating a complementary calculation of an inner groove region and a main region of the sound space region.
Figure 9B:
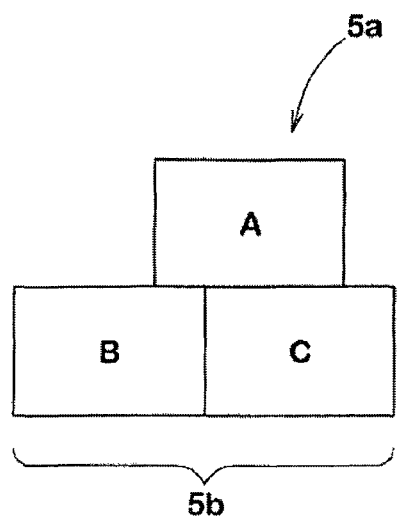

In the aerodynamic simulation using the sound space region 5 of FIGS. 7(A) and 7(B) or FIG. 8, a complementary calculation is carried out at the boundary between the inner groove region 5a and the main region 5b to match the air behaviors of the regions 5a and 5b. FIGS. 9(A) and 9(B) schematically show side views of the sound space region 5. As shown in FIGS. 9(A) and 9(B), when an element A of the inner groove region 5a slides on elements B and C of the main region 5b, the pressure of the element A at a position shown in FIG. 9(B) can be calculated on the basis of the pressures of the elements B and C, a contact area between the element A and the element B, and a contact area between the element A and the element C.

For the outer peripheral surfaces of the sound space region 5 of each of the embodiments, boundary conditions related to, for example, inflow and outflow of air are conveniently set. It should be noted, however, that the surfaces corresponding to the tire surface shape 2P and the road surface shape 4P are defined as walls through which air cannot pass.

Also in the aerodynamic simulation, noise performance is estimated by, for example, calculating a change in pressure of air at one or a plurality of predetermined observation points. The observation point may be set at any convenient position such as near a grounded edge of the tire model 2 and a side of the tire. It should be noted, however, that if the position of the observation point is excessively distanced from the tire model 2, the sound space region 5 needs to be expanded over the distance for a calculation, thereby posing a possibility of an increased number of calculation steps. Contrarily, if the position of the observation point is excessively close to the tire model 2, only a local change in pressure at the close distance is estimated, thereby posing such a possibility that actual noise performance cannot be estimated correctly. In view of these circumstances, the observation point is preferably set near the grounded edge, which is a factor of occurrence of pattern noise. There are two grounded edges, a tire step-in side and a step-up side. The observation point is preferably provided horizontally 100-500 mm beyond a width center of the grounded edge at the tire step-in side and at a height of 10-50 mm, and horizontally 100-500 mm behind a width center of the grounded edge at the tire step-up side and at a height of 10-50 mm.

The tire noise is largely classified into, in terms of its generation mechanism, pumping noise, impact noise, and resonance noise. The pumping noise is a noise that occurs resulting from an air flow and a change in pressure occurring in the vertical groove and the lateral groove of a tire when the vertical groove and the lateral groove are brought into or out of contact from the road surface. The impact noise is a noise that occurs when a groove (mainly the lateral groove) of a tire is brought into contact with the road surface and the tire is thereby oscillated to in turn cause an oscillation of the surrounding air.

The sound space region 5 used in the aerodynamic simulation of the present embodiment incorporates a deformation involved in grounding and off-grounding of the lateral groove 3, a change (oscillation) in the surface shape of the tire model 2 including the tread model portion 2A, and the like. Hence, in the aerodynamic simulation, it is possible to evaluate noise performance that includes the above-described pumping noise and impact noise (such a simulation hereinafter occasionally referred to as a "first simulation").

As described above, the impact noise is a noise that occurs when a groove (mainly the lateral groove) of a tire is brought into contact with the road surface and when the tire surface is thereby oscillated to in turn cause an oscillation of the surrounding air. Thus, it is possible to evaluate only pumping noise performance that occurs from a change in pressure of the inner groove air by carrying out an aerodynamic simulation with the sound space region 5 determined utilizing only a coordinate value, among the surface coordinate values of the tire model 2 obtained from the rolling simulation, that relates to a deformation behavior of the tread groove of the tread model portion 2A. (Such a simulation hereinafter occasionally referred to as a "second simulation.") Specifically, in the sound space region 5 shown in FIGS. 7(A), 7(B) or FIG. 8, the above-described simulation can be carried out by fixing the shape of the main region 5b as unchangeable and sliding the inner groove region 5a over the main region 5b in the circumferential direction of the tire while forcing the inner groove region 5a to be deformed on the basis of the coordinate value.

Then, the value of impact noise performance alone can be quantitatively calculated by subtracting, from noise performance calculated in the first simulation, which includes both a pumping noise component and an impact noise component, a same kind of noise performance calculated in the second simulation, which includes only a pumping noise component. In a noise measurement experiment using an actual tire, it is extremely difficult to separate the noise occurring from the rolling of the tire into the impact noise component and the pumping noise component. By employing the present embodiment, however, the noise can be obtained in the form of the separated components. This improves the investigation of cause of noise occurrence and significantly contributes to development and design of tread patterns that excel in noise suppression property.

The resonance noise is a noise that occurs in the same mechanism as a whistle such that when the vertical groove circumferentially extending in the tread portion is brought into contact with the road surface, an air column is formed between the vertical groove and the road surface for the air to flow through the air column. Considering a running state of an actual tire, the grounded portion of the tire can be said to be moving at the running speed with respect to the surrounding air, and therefore in order to calculate the resonance noise in the aerodynamic simulation, it is effective to define a wind that is a flow of air having a speed equivalent to the running speed from a forward direction of the tire model 2.

Figure 10:
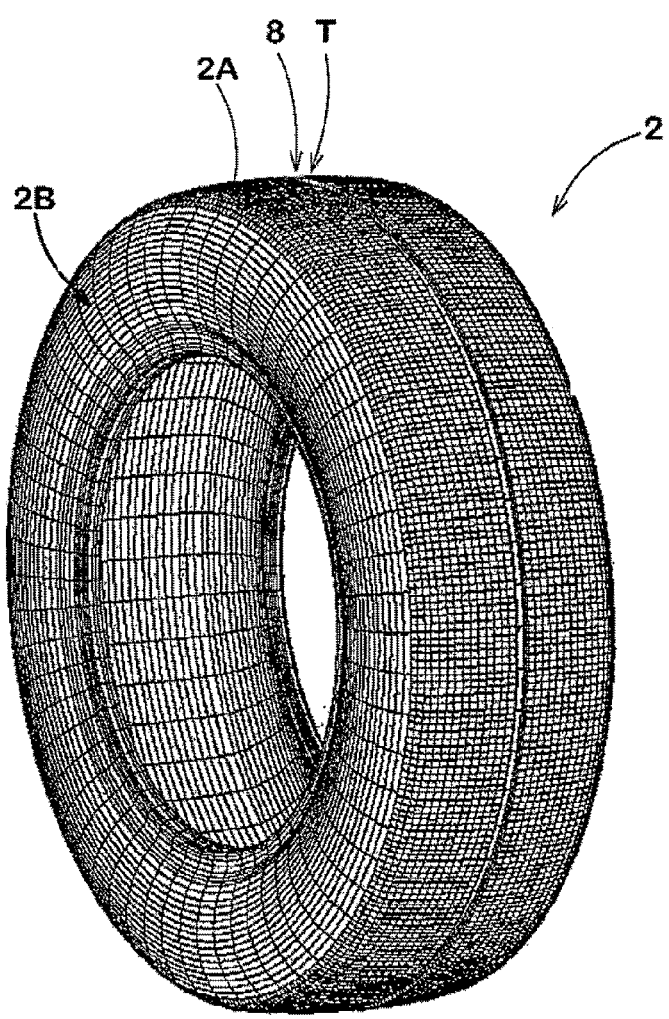
FIG. 10 is a general perspective view of a tire model of another embodiment.

Thus, in the aerodynamic simulation that takes the resonance noise into consideration, the rolling simulation can be carried out using a tire model 2 having a tread model portion 2A provided with a vertical groove 8 that extends circumferentially as the tread groove T, as shown in FIG. 10, and the aerodynamic simulation can be carried out with a condition of a wind equivalent to the running speed defined in the inner groove region of the sound space region 5 corresponding to the vertical groove 8.

With respect to the sound space region 5, it is necessary to set an element size that is large enough to represent a change in pressure that corresponds to a frequency of the noise to be evaluated. For example, assuming a sound speed of approximately 300 m/s and a maximum value of 3000 Hz for the frequency to be evaluated, the wavelength of the noise would be approximately 100 mm. Thus, in order to represent the change in pressure of this wavelength in detail, it is preferable to constitute one half of the wavelength with at least 10 elements, i.e., an element size of 5 mm or less on each side is preferable. It is also preferable that the inner groove region 5$a$ has an element size of approximately 0.1 mm to 2 mm. Further, in a side view of the sound space region 5 as shown in FIG. 7($a$), the elements in the vicinity of circumferential front and rear edge of the grounded surface of the tire model 2 are in the form of wedges that are small in thickness. In order to carry out an analysis by representing such a space in a satisfactory manner, the mesh size in the height direction is preferably 0.01 mm to 0.1 mm.

From the rolling simulation of the tire model 2, time-series surface coordinate values of the tread model portion 2A are acquired. In this respect, a time interval of the acquisition (i.e., a minimum time interval of deformation of the surface coordinate value) preferably matches a time interval of the aerodynamic simulation. For example, in the aerodynamic simulation, assuming that a maximum frequency of the noise to be evaluated (represented) is 3000 Hz, a cycle of one oscillation would be $\frac{1}{3000}$ second. In order to grasp this oscillation in a division of 10, a time interval of $\frac{1}{30000}$ second is necessary, and with this time interval the surface coordinate values of the tread model portion 2A are acquired. It should be noted that for the evaluation of noise performance it is important to grasp air oscillation of at least 1000 Hz, and therefore the time interval of the surface shape of the tread model portion 2A is preferably set at $\frac{1}{10000}$ second or less. The rolling simulation is carried out at a smaller time increment than the above-described time interval of the aerodynamic simulation.

Further, carrying out the aerodynamic simulation utilizing the tire surface shape means that the surface of the tire model 2 is defined as a boundary of the sound space region for analysis of the flow of air. However, in the present embodiment, an influence of a force that is imparted from air to the tire model 2 is not taken into consideration. This is because such a force is extremely small and the deformation of the tire from the force is sufficiently small. Hence, it is safe to disregard the force out of calculation. It should be noted, however, that it is of course possible to take external force from air to the tire into consideration by, for example, simultaneously carrying out a structural analysis of the rolling simulation of the tire model 2 and a fluid analysis of the aerodynamic simulation so as to carry out what is called a coupling on a minute time basis, i.e., imparting the boundary of the sound space region from the rolling simulation (structural analysis) to the aerodynamic simulation side while imparting a force from the aerodynamic simulation (fluid analysis) to the rolling simulation side.

Next, upon completion of the aerodynamic simulation, various physical quantities related to noise performance are output, examples including a change in air pressure at an observation point, a flow rate, and an air pressure distribution of each of the parts of the sound space region 5 at a convenient time (step S8). On the basis of the output, noise performance is evaluated (step S9). When the noise performance is within a range of tolerance (Y in step S9), a tread pattern is designed on the basis of the above-described tire model 2, and vulcanization molding of a tire having this tread pattern is carried out (step S10). This realizes production of a tire that excels in noise performance in a relatively short time and at low cost. When the noise performance is outside the range of tolerance as a result of the simulation (N in step S9), a new tire model 2 is set with a modified specification of the tread groove T and the like (step S1), and a similar simulation is repeated until the noise performance is within the range of tolerance.

While the embodiment of the present invention has been described in detail, it will be understood that the present invention will not be limited to the above-described embodiment and that various modifications are possible within the scope of the present invention.

EXAMPLES

Examples of Pumping Noise and Impact Noise

With the use of a tire model provided with only one lateral groove on the tread portion as shown in FIG. 3, a simulation of noise performance of the present embodiment was carried out in accordance with the processing procedure shown in FIG. 2. A specification of the tire model is as follows.

Tire size: 195/60R15.

Groove width of the lateral groove: 5 mm.

Depth of the lateral groove: 7 mm.

The tire model has its tread model portion more minutely divided into elements than the body model portion in the following manner, in order to grasp a deformed shape of the tread portion in more detail.

Number of all of the elements of the tire model: Approximately 100000 elements.

Number of circumferential divisions of the tread model portion: 300.

Number of circumferential divisions of the body model portion: 60.

Further, conditions for the rolling simulation are as follows.

A time interval (initial value) of deformation calculation of the tire model: $1 \times 10^{-6}$ seconds.

A specification of the road surface: a cylindrical drum of a circumferential length of 10 m.

Load: 4 kN.

Running speed: 40 km/h.

Further, in the aerodynamic simulation, surface coordinate values of the tread model portion including deformations of the tire grounding surface and the lateral groove over the groove-grounded rolling distance were obtained from a result of the rolling simulation at time intervals of $\frac{1}{100000}$ second. The sound space region used was of the type fixing the main region and sliding the inner groove region over the main region in the circumferential direction, as shown in FIGS. 7(A), 7(B). Furthermore, an evaluation value of noise performance was set at the pressure of air at an observation point. The observation point was set to be horizontally 240 mm behind a width center of the grounded edge at the tire step-up side and at a height of 25 mm.

Figure 11:
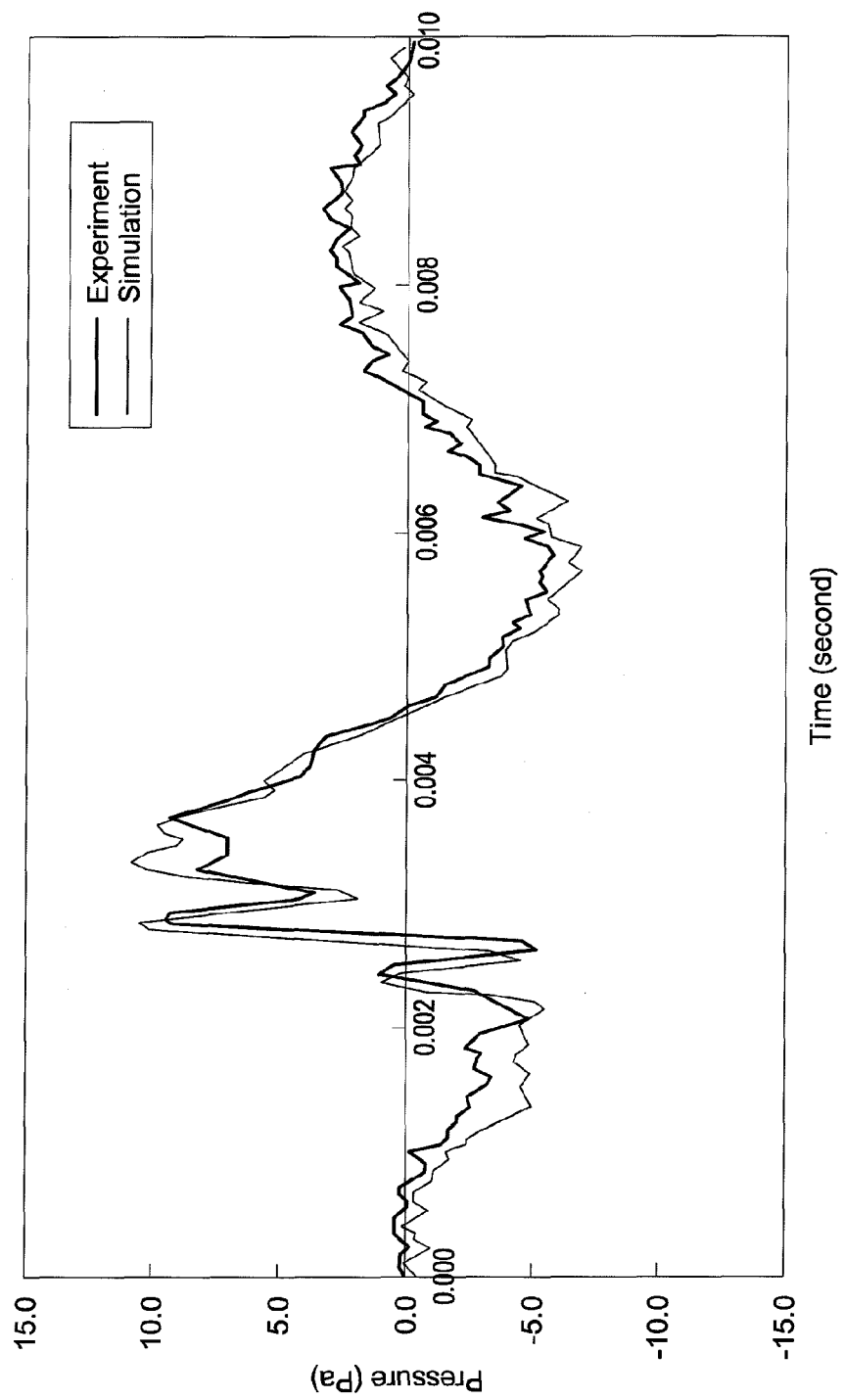
FIG. 11 is a graph showing, as a simulation result, a relationship between air pressure and time at an observation point.

By the above-described simulation, performance of the pumping noise and impact noise of a tire model can be evaluated (a first simulation). It should be noted that since the above-described tire model is not provided with a vertical groove, there is substantially no occurrence of resonance noise. FIG. 11 shows, as a result of a simulation including the above-described groove-grounded rolling distance a-d, a graph with the air pressure at the observation point set on the vertical axis and time (second) set on the lateral axis. Also shown is a thin line that is a result of a noise evaluation carried out in a similar manner to the above simulation using an actual tire. The 0.000 point of time on the time axis shows a state right before step-up of the lateral groove (i.e., air pressure at the rear side of the tire after the lateral groove has passed the road surface). From the result shown in FIG. 11, it can be seen that the simulation and the actual measurement are extremely highly related to one another.

Figure 12:
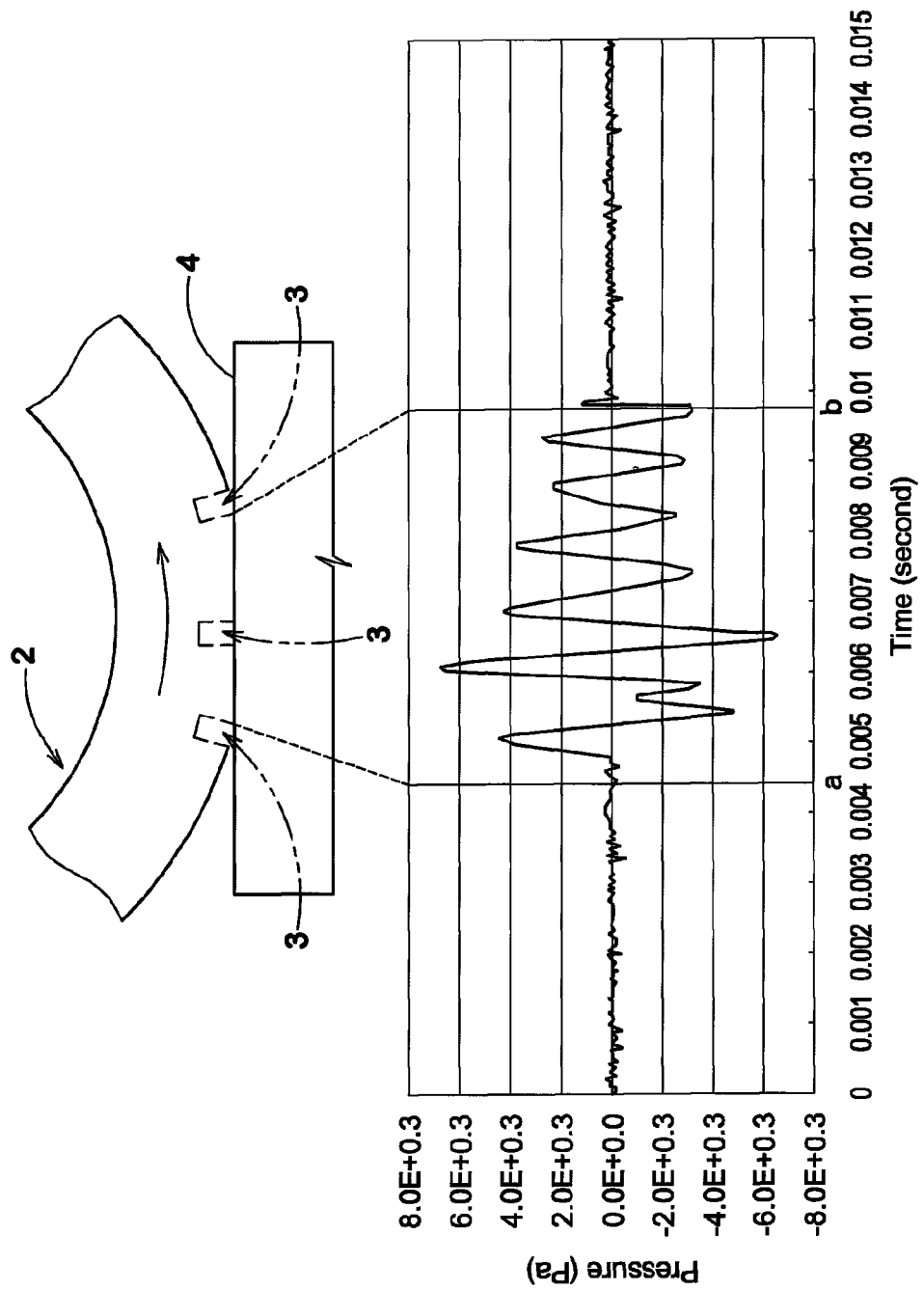
FIG. 12 is a graph showing, as a simulation result, a relationship between air pressure and time at a lateral groove.

FIG. 12 shows pressure in the lateral groove over the groove-grounded rolling distance a-d. For the distance over which the lateral groove is grounded, a periodical change in pressure is observed in the lateral groove. This phenomenon is referred to in, for example, "Study on Occurrence of Tire/Road Surface Noise," Hiroshi Koike and Tatsuo Fujikawa, Research Journal, Vol. 21, No. 7, published by JARI. As is understood from this data, the change in pressure inside the tread groove cannot be revealed unless by simulating the behavior of air or be simply calculated from information about a change in the cross sectional area of the groove.

Also, while in the above-described simulation the obtained noise performance includes both pumping noise and impact noise, a second simulation may carried out taking only the deformation of the lateral groove into consideration with the grounded surface of the tire fixed to avoid deformation, thereby making it possible to evaluate only the pumping noise resulting from a change in pressure inside the lateral groove. Then, a result of the second simulation was subtracted from the result of the first simulation to isolate and extract the impact noise of the tire model.

Figure 13:
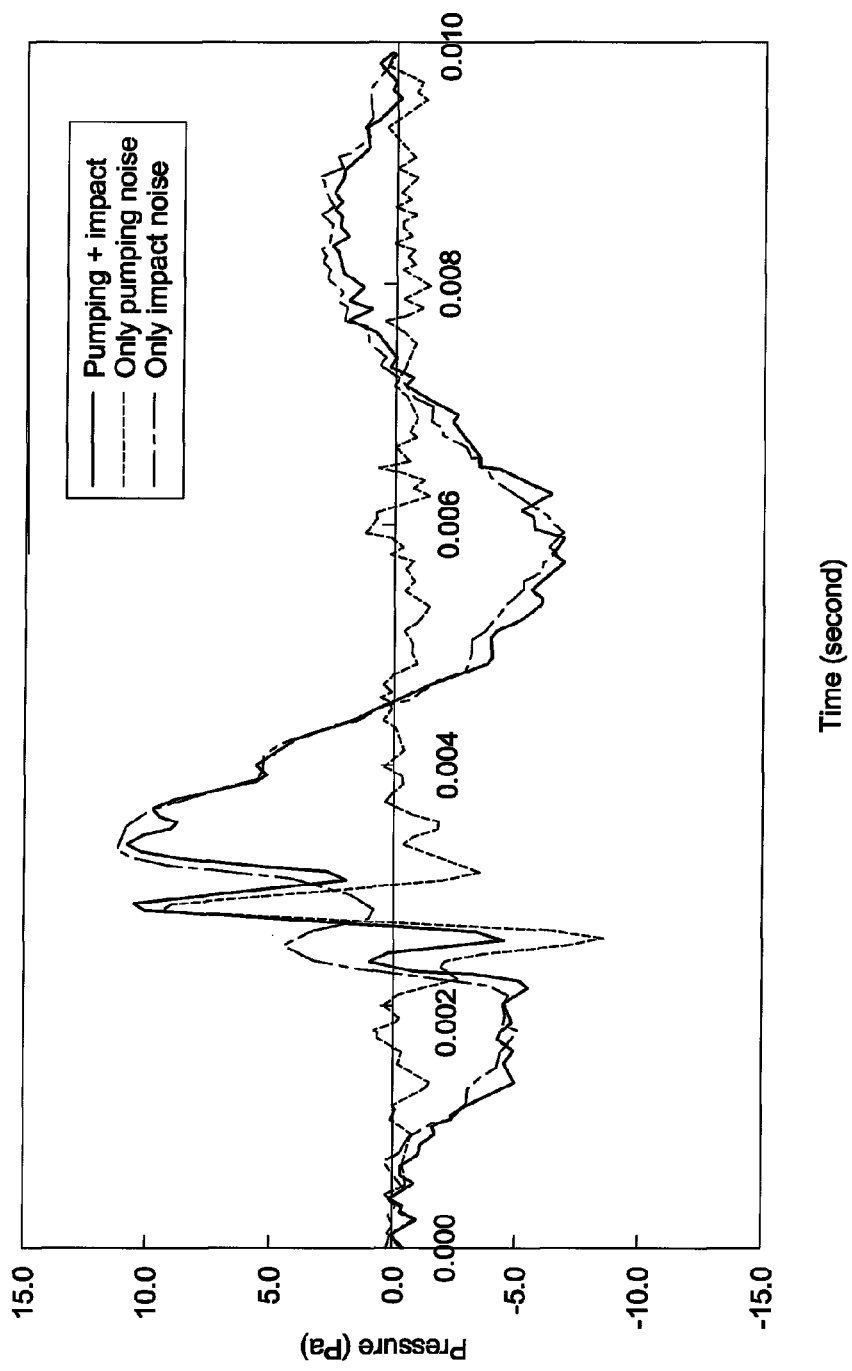
FIG. 13 is a graph showing, as a simulation result, a relationship between air pressure and time for each of noise components.

FIG. 13 shows results of a noise including the pumping noise and the impact noise, of the pumping noise alone, and of the impact noise alone. The results indicate that the pumping noise is a stimulating noise of pressure change that occurs at a moment of passing of the lateral groove. It can be seen, on the contrary, that the impact noise is an undulating noise of pressure change that occurs even after passing of the lateral groove.

Examples of Resonance Noise

Next, a simulation of resonance noise was carried out. In this simulation, a tire model provided with only one vertical groove on the tread portion as shown in FIG. 10 was used to carry out a simulation of noise performance of the present embodiment in accordance with the processing procedure shown in FIG. 2. A specification of the tire model is as follows.

Tire size: 195/60R15.
Groove width of the vertical groove: 5 mm.
Depth of the vertical groove: 7 mm.
The number of divisions of the body model portion and the tread model portion of the tire model were the same as those in the foregoing examples.

Further, conditions for the rolling simulation are as follows.
A time interval (initial value) of deformation calculation of the tire model: $1 \times 10^{-6}$ seconds.
A specification of the road surface: a flat road.
Load: 4 kN.
Running speed: 80 km/h.

According to an air column experiment that has been carried out thus far and to a calculation theory, it is known that a pneumatic tire having the above-described vertical groove meets with a resonance noise of approximately 800 Hz. Thus, in this example, whether a resonance noise of approximately 800 Hz was reproduced in the simulation was examined.

Further, in the aerodynamic simulation, surface coordinate values of the tread model portion including deformations of the tire grounding surface and the lateral groove over the groove-grounded rolling distance were obtained from a result of the rolling simulation at time intervals of 1/1100000 second. The sound space region used was of the type fixing the main region 5b and sliding the inner groove region over the main region 5b in the circumferential direction, as shown in FIGS. 7(A), 7(B). Furthermore, an evaluation value of noise performance was set at the pressure of air at an observation point. The observation point was set to be horizontally 240 mm behind a width center of the grounded edge and at a height of 25 mm.

Further, similarly to the example of the above-described pumping noise and impact noise, a rolling simulation was carried out using a tire model to acquire surface coordinate values representing deformed shapes of the groove and the tread surface. On the basis of the values, the sound space region of the aerodynamic simulation was determined and divided into elements, thus carrying out the aerodynamic simulation. Also in the aerodynamic simulation, a wind equivalent to a running speed of 80 km/h was defined to blast onto the tire model from a forward direction of the tire model.

Figure 14:
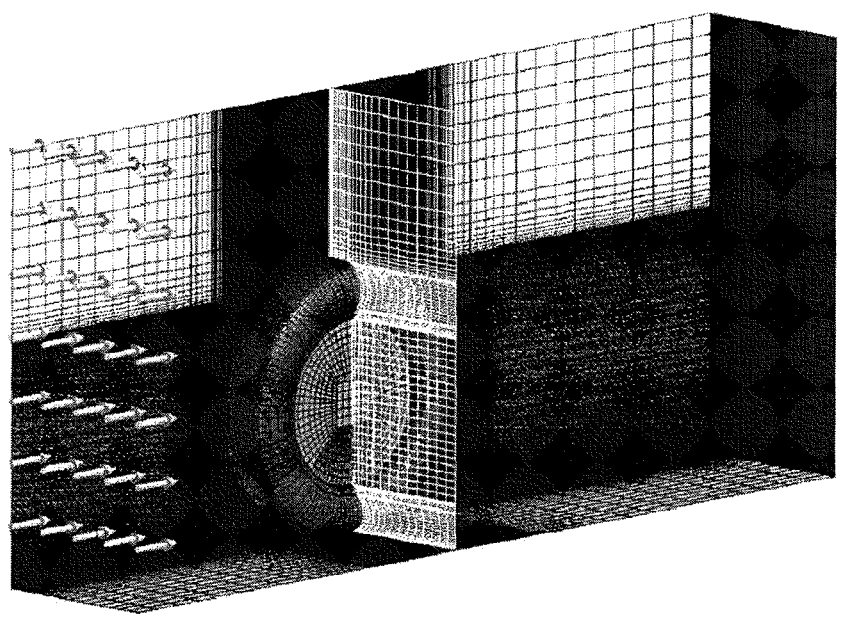
FIG. 14 is a general view of a simulation model of resonance noise.
Figure 15:
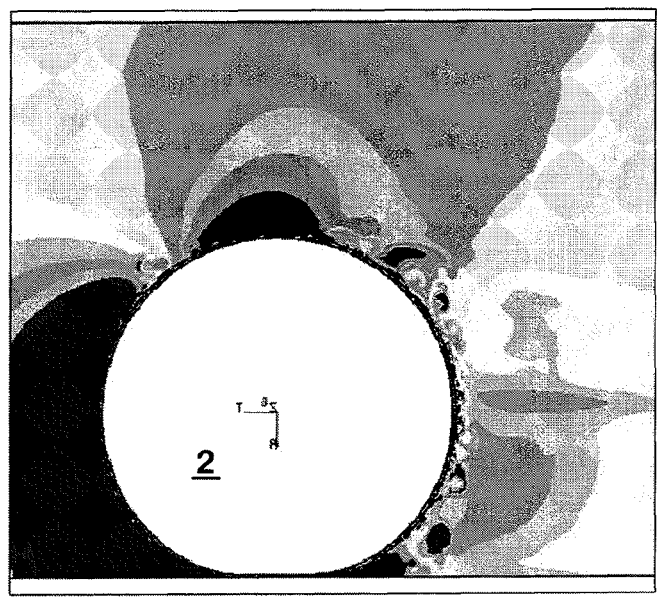
FIG. 15 is a contour diagram showing air pressure around a tire model, which is a simulation result.

For reference, see FIG. 14 showing a general view of a simulation model of resonance noise. In the drawing, the outer frame indicates the sound space region, and the cylindrical shapes seen on the left indicate arrows for directions of wind. FIG. 15 shows, as a result of the simulation, pressure contour lines of the sound space region. The thicker the color is in FIG. 15, the higher the air pressure becomes. In FIG. 15, the wind equivalent to the running speed is blasted from the left side, and therefore it can be seen that high pressure is distributed on the left side of the tire model (the portion colored in white). At an observation point located at a (right) lower portion of the tire model, a change in pressure of air having passed the vertical groove is observed.

Figure 16:
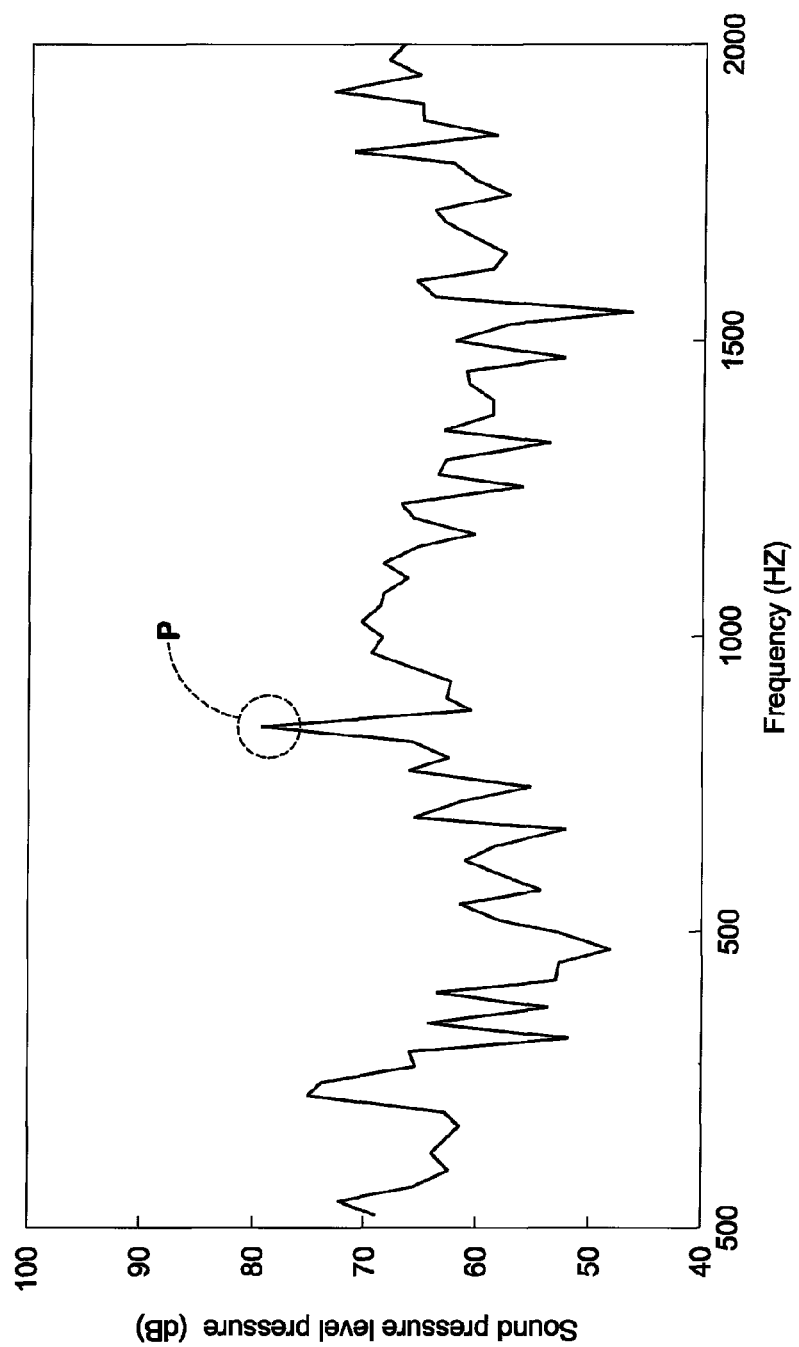
FIG. 16 is a graph showing, as a simulation result, an analysis result of frequency of pressure at the observation point.

FIG. 16 shows a result of a frequency analysis of pressure change at the above-described observation point. As clearly seen from the drawing, a clear peak P is observed in the vicinity of 800 Hz. That is, it can be seen that the simulation of the present embodiment clearly represents the resonance noise.

The invention claimed is:

1. A method for simulating tire noise performance using a computer, the method comprising:
   using the computer to perform a step of setting, using a finite number of elements, a tire model having a tread model portion provided with at least one tread groove;
   using the computer to perform a step of setting a road surface model using a finite number of elements;
   using the computer to perform a step of carrying out a rolling simulation to roll the tire model on the road surface model at least over a groove-grounded rolling distance where the tread groove is grounded on the road surface model and rolled;
   using the computer to perform a step of acquiring a surface coordinate value of the tread model portion in the groove-grounded rolling distance in a time-series manner;
   using the computer to perform a step of setting a sound space region around the tread model portion, the sound space region having a shape changing based on the acquired surface coordinate value of the tread model portion; and
   using the computer to perform a step of carrying out an aerodynamic simulation using the sound space region, wherein the sound space region comprises an inner groove region corresponding to an inner space of the tread groove and another region as a main region surrounding the tire model; and wherein the simulation method further comprises the following steps performed using the computer:

a first simulation step of carrying out the aerodynamic simulation with both the inner groove region and the main region being deformed during the aerodynamic simulation;

a second simulation step of carrying out the aerodynamic simulation with the inner groove region being deformed and the main region being unchanged during the aerodynamic simulation; and a calculating step of impact noise performance by subtracting noise performance obtained in the second simulation from noise performance obtained in the first simulation.

2. The method for simulating tire noise performance according to claim 1, wherein the inner groove region is divided into elements in a smaller manner than the main region.

3. The method for simulating tire noise performance according to claim 1 or 2, wherein the aerodynamic simulation comprises processing of fixing the main region at a position and circumferentially moving the inner groove region along the main region to change the shape of the sound space region.

4. The method for simulating tire noise performance according to claim 1, wherein the tread groove comprises a lateral groove extending obliquely with respect to a tire circumferential direction.

5. The method for simulating tire noise performance according to claim 1, wherein the tread groove comprises a vertical groove extending in a tire circumferential direction;

the sound space region comprises an inner groove region corresponding to an inner space of the vertical groove; and the aerodynamic simulation comprises defining a condition for hitting a blast of air that corresponds to a running speed at least against the inner groove region.

6. A method for producing a pneumatic tire, comprising:

a step of carrying out the method for simulating tire noise performance as set forth in claim 1;

a step of designing a tread pattern based on a tread model portion of a tire model used in the method for simulating tire noise performance; and a step of molding a tire having the tread pattern by vulcanization.

* * * * *